United States Patent [19]
Kamei et al.

[11] Patent Number: 5,783,055
[45] Date of Patent: Jul. 21, 1998

[54] MULTI-CHAMBER SPUTTERING APPARATUS

[75] Inventors: Mitsuhiro Kamei, Takahagi; Eiji Setoyama, Hitachi; Satoshi Umehara, Hitachioota, all of Japan

[73] Assignee: Hitachi, Ltd., Tokyo, Japan

[21] Appl. No.: 607,431

[22] Filed: Feb. 27, 1996

[30] Foreign Application Priority Data

Feb. 28, 1995 [JP] Japan .................................. 7-039679

[51] Int. Cl.$^6$ .................................................. C23C 14/56
[52] U.S. Cl. .................. 204/298.04; 204/298.15; 204/298.23; 204/298.25; 204/298.26; 204/298.27; 204/298.28; 204/298.29
[58] Field of Search ................ 204/298.04, 298.05, 204/298.15, 298.23, 298.25, 298.26, 298.27, 298.28, 298.29, 192.11

[56] References Cited

U.S. PATENT DOCUMENTS

| | | | |
|---|---|---|---|
| 4,465,416 | 8/1984 | Burkhalter et al. | 204/298.25 |
| 4,664,935 | 5/1987 | Strahl | 204/298.28 |
| 4,674,621 | 6/1987 | Takahsahi | 204/298.25 |
| 4,951,601 | 8/1990 | Maydan et al. | 118/719 |

FOREIGN PATENT DOCUMENTS

| | | | |
|---|---|---|---|
| 60-238479 | 4/1986 | Japan | 204/298.25 |
| 2-30759 | 2/1990 | Japan . | |
| 4-221072 | 8/1992 | Japan . | |
| 5-51742 | 3/1993 | Japan | 204/298.04 |

*Primary Examiner*—Nam Nguyen
*Assistant Examiner*—Rodney G. McDonald
*Attorney, Agent, or Firm*—Fay, Sharpe, Beall, Fagan, Minnich & McKee

[57] ABSTRACT

A multi-chamber sputtering apparatus characterized in that a plurality of target electrodes and a substrate transfer mechanism which is able to transfer a substrate to positions facing the target electrodes and change distance between the target electrodes and the substrate.

4 Claims, 2 Drawing Sheets

MULTI-CHAMBER SPUTTERING APPARATUS

BACKGROUND OF THE INVENTION

The present invention relates to a multi-chamber sputtering apparatus and, more particularly, to a multi-chamber sputtering apparatus which has a plurality of processing chambers and valves which are able to partition the plurality of processing chambers while maintaining the chambers in vacuum, whereby the processing chambers can be operated in parallel with each other.

Sputtering apparatus are widely used for forming thin films of various materials. Sputtering methods effected by the sputtering apparatus are to form thin films by discharging a gas such as argon in vacuum of about $10^{-1}$–$10^{-4}$ Torr, sputtering a target with ions generated at the time of discharging, and then piling up sputtering particles on a substrate disposed at a position facing the target.

Sputtering apparatus of various types are considered according to uses thereof.

A batch type sputtering apparatus requires much time for evacuating the chambers since the chambers are opened to atmosphere every time processing of a substrate is finished. Therefore, a so-called in-line type sputtering apparatus, in which a plurality of vacuum chambers are arranged in a straight line and a substrate is processed while keeping other chambers at a greater vacuum than a substrate preparation chamber and a substrate removal chamber, are used as mass-production apparatus.

However, the in-line type sputtering apparatus requires a straight long space, and the whole apparatus is stopped when maintenance work is carried out in any chamber of the apparatus. Therefore, recently, cases are increasing wherein a single wafer type multi-chamber sputtering apparatus is used as a mass-production apparatus, which single wafer type multi-chamber sputtering apparatus has a plurality of processing chambers provided around a transfer chamber containing therein a robot for transferring substrates, and carries out various processes including film formation while transferring the substrate to each processing chamber, using the robot. In the multi-chamber sputtering apparatus, it is possible, while effecting maintenance work of some of the processing chambers other than the transferring chamber, to carry out processing in the other processing chambers.

FIG. 3 shows a conventional multi-chamber sputtering apparatus. As shown in FIG. 3, in the conventional multi-chamber sputtering apparatus, a preparation/removal chamber 1 is connected to a transfer chamber 2 through a gate valve 11. The transfer chamber 2 is further connected to a first sputtering chamber 3, a second sputtering chamber 4 and a third sputtering chamber 301 through gate valves 11. Each sputtering chamber 3, 4, 301 is provided with one target.

The conventional multi-chamber sputtering apparatus is constructed so that because of construction of a robot 7 provided in the transfer chamber 2 disposed at the center of the apparatus, and a substrate receipt delivery mechanism of each processing chamber, the substrate is subjected to a process in a state of the substrate being fixed in each processing chamber, and again transferred to other processing chambers by the robot 7 after being subjected to only one process in each processing chamber.

Relevant prior art disclosing multi-chamber sputtering apparatus include JP A 2-30759, JP A 4-221072 can be raised, for instance.

In general, a multi-chamber sputtering apparatus is provided with at least one preparation/removal chamber and chambers for effecting pretreatment before film formation, for example, heating and cleaning a substrate, etc., and is constructed in a square or hexagon around a robot-including substrate transfer chamber at the center.

Therefore, the number of the film formation chambers is about 2 to 4. However, in case of film formation for a magnetic head, for example, in some cases, film formation of 4 to 5 or more layers or repeated film formation of two layers or more is required. Further, in case a plurality of targets are much different in amount of target used for film formation, in some cases, a plurality of targets to be used often for film formation are prepared in advance, considering cyclic period of maintenance.

Therefore, in the conventional apparatus, the maintenance cyclic period is restricted by kind of targets, at the same time in the case where the targets are used individually, the maintenance cyclic period is determined by a target, the used amount of which is the largest of the plurality of targets. Accordingly, it was impossible to increase relatively freely the number of targets and balance the amount of target used, as in the in-line sputtering apparatus. Further, in case of film formation of multi-layers, productivity is lowered because of the time required for transferring a substrate between the processing chambers, and at the same time the quality of formed films may be detracted due to formation of oxidized film, etc. because there is time lapsed between one layer formation and another layer formation.

SUMMARY OF THE INVENTION

An object of the present invention is to provide a multi-chamber sputtering apparatus which is high in productivity and quality of film produced, by providing a plurality of targets in at least one of a plurality of processing chambers, making uniform the amount of target used in the processing chambers, and reducing the transfer time between the processing chambers to zero.

In order to achieve the above object, at least one processing chamber, is provided with a mechanism enabling a substrate to move in the processing chamber, and a plurality of targets so that the substrate can be moved to positions facing the targets. Further, an ion beam sputtering chamber with assist is provided as one of the processing chambers, making it possible to form a film of high performance or quality.

Further, a mechanism that enables up and down movement is provided on the substrate moving mechanism in the processing chamber for optimising the distance (usually called the distance between electrodes) between the target and the substrate by patterning the ground film of the substrate, further increasing the productivity.

By the substrate transfer mechanism provided in the processing chamber, formation of a multi-layer film by repeatedly sputtering in the processing chamber is possible without extending the time intervals between one layer formation and another film formation. Further, on a target which is larger in amount of target used as compared with the other targets, it is possible to equalize the life of the target to the other targets by providing a plurality of targets.

In the present invention, at least one processing chamber is provided with two or more targets, and the substrate transfer mechanism provided in the processing chamber enables a substrate transferred in the processing chamber to be subject to film formation by each of the targets in the processing chamber. For example, even if an amount of target used in the processing chamber is twice the amount of target used in another processing chamber, it is possible to equalize the life of the target in the processing chamber to the life of target in the other processing chamber by using two targets, and it is possible to extend the cyclic maintenance period to twice the conventional cyclic maintenance period.

Further, by changing the kind of target in the processing chamber, repeated sputtering for multi-layer film formation is possible in short time within the processing chamber, which results in a remarkable improvement in productivity.

Further, by providing an ion beam sputtering chamber as one of the processing chambers, it is possible to form films of high function.

DESCRIPTION OF THE EMBODIMENTS

Figure 1:
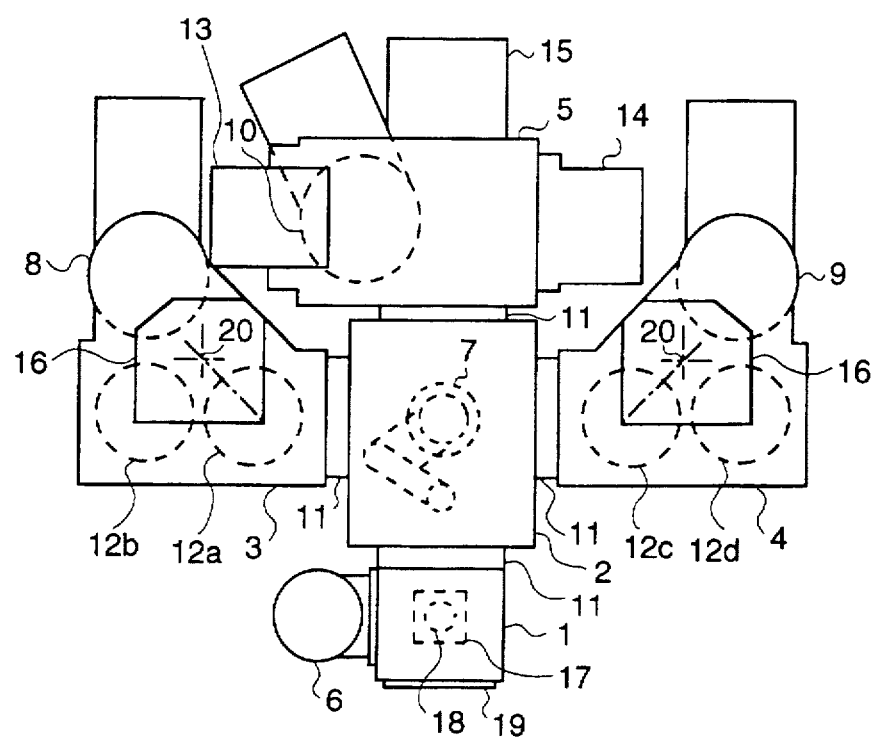
FIG. 1 is a plan view of an embodiment of a multi-chamber sputtering apparatus according to the present invention.

An embodiment of the present invention is described hereunder in detail referring to the drawings.

FIG. 1 shows an embodiment of a multi-chamber sputtering apparatus constructed according to the teachings of the present invention.

In FIG. 1, at least one substrate 18 is held by a substrate holder 17 and is contained in a preparation/removal chamber 1. The substrate 18 can be prepared and removed by opening a door 19 under the atmospheric condition of the preparation/removal chamber 1. After preparation of the substrate 18, the door 19 is closed and then the preparation/removal chamber 1 is evacuated by a vacuum pumping device (not shown) to maintain the chamber in vacuum. The preparation/removal chamber 1 is connected to a transfer chamber 2 through a gate valve 11. The transfer chamber 2 is connected to a first sputtering chamber 3, a second sputtering chamber 4 and an ion beam sputtering chamber 5 by respective gate valves 11, and the chambers can be independently evacuated to vacuum or set to the atmospheric condition.

The first sputtering chamber 3 has target electrodes 12a, 12b mounted therein. In general, the target electrodes 12a, 12b are taken in from a lower face of the first sputtering chamber 3 and mounted on an upper flange of the chamber, and a substrate electrode is supported from an upper face. A gas is introduced into the first sputtering chamber 3 by a gas supply line (not shown), under this condition, power is supplied to the target electrode 12a or 12b from a power source for sputtering (not shown), whereby the target is sputtered. A film is thus formed on the substrate 18 held on the substrate electrode, whose position can be changed using a substrate transfer mechanism 16.

Figure 2:
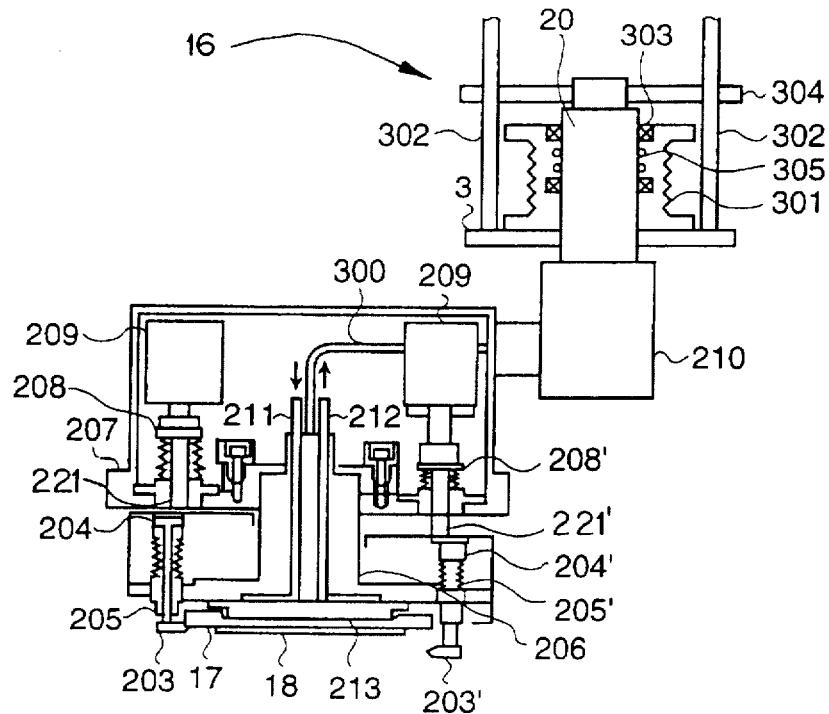
FIG. 2 is a sectional view of a detailed structure of a substrate electrode according to the present invention.
Figure 3:
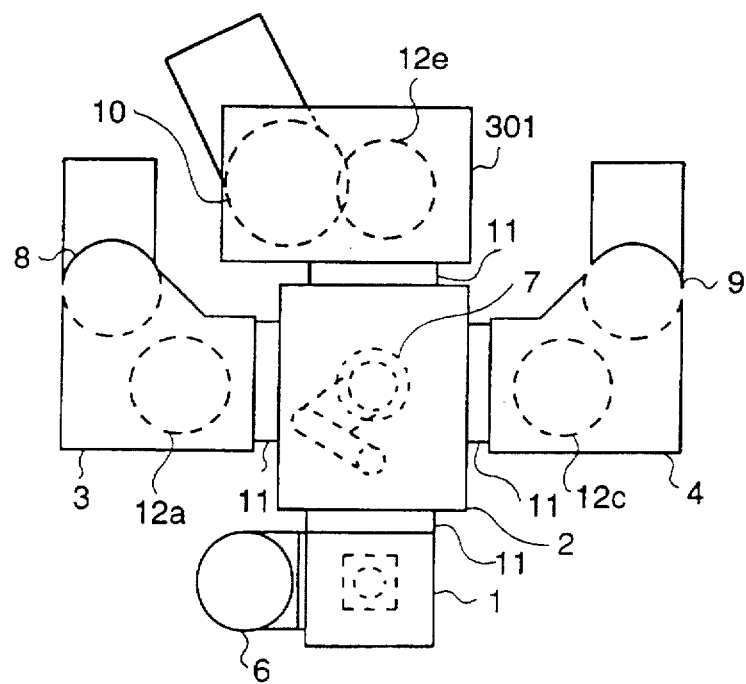
FIG. 3 is a plan view of a conventional multi-chamber sputtering apparatus.

The substrate electrode is shown in detail in FIG. 2.

The substrate electrode comprises a rotating portion 210, a drive system housing 207, a water-cooled plate 213, etc., and electric power is supplied to the substrate holder 17 through a wire 300, a cooling 25 water introducing shaft 206 and the water-cooled plate 213. Cooling water recirculated through a cooling water inlet 211 and a cooling water outlet 212 enters the water-cooled plate 213 at the cooling water introducing shaft 206. A substrate holder retainer 203 is fixed to tips of retainer support pins 204. In general, the expanding force of a spring 205 urges upwards the substrate holder retainer 203 together with the retainer support pin 204.

Here, under the condition that the substrate holder 17 is not present, an axially moving pin 221 connected to a cylinder 209 through a bellows 208 is pressed downwards as shown by 208', 221', whereby the spring 205' is compressed to press down and lower a substrate holder retainer 203'. Under the condition that the substrate holder retainer 203' is left lowered, the substrate holder 17, transferred by a substrate transfer robot 7 in the transfer chamber 2 shown in FIG. 1, is inserted between the substrate holder retainer 203' and the water-cooled plate 213, and then the cylinder 209 is raised, whereby the retainer support pin 204 is raised by force of the spring 205, and the substrate holder 17 can be held by the substrate holder retainer 203.

The drive system housing 207 is a sealed container, which can be separated fluidly from the outside thereof, which is at vacuum pressure. Therefore, the interior of the housing 207 can be at atmospheric pressure. The whole substrate electrode can be rotated around a rotating shaft 20 by the substrate transfer mechanism 16 through the rotating portion 210.

A part of the substrate transfer mechanism 16 is shown in FIG. 2. The mechanism 16 includes guide members 302 mounted on the first sputtering chamber 3 for guiding up and down movement, an axially moving plate 304 connected to the rotating shaft 20 to axially move the shaft 20, and a bellows 301 for keeping the interior of the first sputtering chamber 3 in vacuum. Bearings 303 and O-rings 305 are provided between the rotating shaft 20 and the bellows device 301. The rotating shaft 20 is driven to rotate by a drive mechanism such as a motor (not shown) of the substrate transfer mechanism 16 and axially moved by the axially moving plate 304 which is driven by a driver (not shown).

Returning to FIG. 1, the first sputtering chamber 3 can be kept in vacuum by an evacuating apparatus (not shown) connected to an exhaust port 8. The substrate electrode can rotate around the rotation shaft 20 and be shifted axially by the substrate transfer mechanism 16, so that the target electrodes 12a and 12b can be easily transferred to corresponding positions (facing the substrate). The second sputtering chamber 4 has substantially the same construction as the first sputtering chamber 3.

The ion beam sputtering chamber 5 is provided with a target holder 15, an ion source 13, and an assist ion source 14, in addition to the substrate electrode as mentioned above. Four targets can be mounted on the target holder 15, for example, and film formation by ion beam sputtering is possible. The ion beam sputtering chamber 5 is evacuated to vacuum pressure by an evacuating apparatus (not shown) connected to an exhaust port 10.

Further, the assist ion source 14 can be used as an ion source for milling, whereby milling and sputtering are possible in the course of the same processing operation for a substrate 18. For example, for a magnetoresistance effect film, contact resistance with a ground film becomes a problem, so that a film is formed after cleaning of the substrate surface. However, in a conventional method, these operations were practiced by different apparatus. Therefore, the effect of the cleaning was apt to weaken. According to the present invention, however, continuous film formation is possible in the first sputtering chamber 3 or the second sputtering chamber 4 after milling of the substrate surface, without exposing the substrate to the atmosphere during the processing.

In the conventional multi-chamber sputtering apparatus, as the number of targets increases, it is necessary to change the number of the chambers around the transfer chamber. However, the number of chambers is limited to 4 to 5, considering the scale thereof.

Further, in the present invention, if contamination between targets in the same sputtering chamber becomes a problem, an adhesion-preventing cover can be provided between the target electrodes. However, in the conventional construction, in a case where a multi-layer film is formed by piling up a plurality of layers, since time is required for transferring the substrate between the chambers, film characteristic of the film formed is detracted in addition to the extension of the tact time.

In this manner, according to the construction of this embodiment of the present invention, a multi-layer film can be formed in a shorter time as compared with that by a conventional apparatus, and productivity is improved. Further, influence by the boundary between the layers is not likely to appear, whereby the film characteristic of the multi-layer film can be expected to increase remarkably. Further, it is unnecessary to increase the number of vacuum chambers even if the kind of targets increases. Therefore, it is possible to make the apparatus smaller and the cost lower.

Further, where a plurality of targets are different in the amount of target used, a plurality of targets are prepared in advance, and the time of use of each target is made uniform, whereby maintenance time is reduced and the working rate can be increased remarkably. For example, where two targets (1) and (2) are used for forming a film of thickness (1) and a film of thickness (2) (which is just twice the thickness (1)), respectively, when the target (2) reaches the end of its life span, the target (1) is consumed to only half its life. Therefore, if two targets are prepared in advance for the target (2), the time at which the targets are exchanged can be made the same. Further, by adding the ion beam sputtering chamber, films of much higher performance can be formed as compared with those formed by the conventional multi-chamber sputtering apparatus.

According to the multi-chamber sputtering apparatus of the present invention, in at least one vacuum chamber, a plurality of target electrodes and a substrate transfer mechanism, which can transfer the substrates to positions corresponding to the target electrodes and change the distance between the target electrodes and the substrate, are provided, so that the amounts of target used in each processing chamber can be made uniform and the transfer time between the chambers can be reduced to zero. Thus, a multi-chamber sputtering apparatus which has high productivity and film quality can be provided.

What is claimed is:

1. A multi-chamber sputtering apparatus comprising:

a plurality of vacuum chambers;

a plurality of target electrodes arranged in one of said vacuum chambers, for forming a film on a substrate by sputtering said target electrodes and piling, on the substrate, sputter particles scattered by the sputtering;

a transfer chamber containing therein a transfer robot for transferring the substrate to and from a first one of the vacuum chambers while maintaining said vacuum chambers in vacuum; and a substrate transfer mechanism, in said first one of the vacuum chambers, for transferring the substrate between positions respectively facing said plurality of target electrodes, and for changing respective distances between said plurality of target electrodes and the substrate, wherein said substrate transfer mechanism includes:

a substrate holding mechanism for holding the substrate in a horizontal state from an upper major surface of the substrate;

a rotating mechanism for rotating the horizontally-held substrate around an axis perpendicular to a plane containing the horizontally-held substrate so as to respectively present the substrate to face each of said target electrodes for sputtering; and a mechanism for moving the horizontally-held substrate in a direction perpendicular to said plane to change the distance between the substrate and the target electrode to which the substrate is presented for sputtering.

2. A multi-chamber sputtering apparatus according to claim 1, further comprising an ion source and a target electrode in a second one of said vacuum chambers other than said one of the vacuum chambers, for ion beam sputtering in said second one of the vacuum chambers.

3. A multi-chamber sputtering apparatus according to claim 1, wherein an indefinite geometric line containing said axis about which the substrate is rotated does not pass through said horizontally-held substrate.

4. A multi-chamber sputtering apparatus according to claim 1, further comprising a substrate holder by which the substrate is held when in said horizontal state, wherein said substrate holding mechanism horizontally holds the substrate holder.

* * * * *